June 3, 1969 P. P. CASTRUCCI ET AL 3,447,984
METHOD FOR FORMING SHARPLY DEFINED
APERTURES IN AN INSULATING LAYER
Filed June 24, 1965

INVENTOR
PAUL P. CASTRUCCI
SAMUEL S. IM
BY Harry M Weiss
ATTORNEY 3,447,984
METHOD FOR FORMING SHARPLY DEFINED APERTURES IN AN INSULATING LAYER Paul P. Castrucci and Samuel S. Im, Poughkeepsie, N.Y., assignors to International Business Machines Corporation, Armonk, N.Y., a corporation of New York Filed June 24, 1965, Ser. No. 466,623
Int. Cl. C23f *1/02*
U.S. Cl. 156—11 6 Claims

ABSTRACT OF THE DISCLOSURE

A method of forming an opening in an insulating layer which involves selectively removing a metal layer formed on the insulating layer to leave a metal plug over the area of the surface of the insulating layer through which an opening is to be formed. The insulating layer may be, for example, glass and the metal layer may be selected from the class of metals that adheres well to the insulating layer. A masking layer is formed over the exposed surface of the insulating layer and on the top surface of the metal plug. The metal plug and the portion of the insulating layer originally beneath the metal plug are etched away to leave an opening in the insulating layer.

This invention relates generally to a method for forming sharply defined apertures in an insulating layer and, more particularly, relates to a method for forming small diameter holes or narrow moats in a thin glass film located on the surface of a semiconductor body, particularly useful in forming isolating moats in the semiconductor body.

The present trend in the electronics and the computer fields is toward miniaturization of semiconductor or solid-state components. Today efforts are being made to manufacture successfully a multiplicity of semiconductor devices from a single small wafer of semiconductor material. For example, it may be desirable to make about 400 transistors having substantially identical dimensional and electrical characteristics from a single semiconductor starting wafer is less than one-half inch square and has a thickness of about 10 mils.

In order to manufacture a plurality of semiconductor devices on a single substrate, it is often necessary to form holes in an insulating protective layer located on the surface of the substrate either for diffusion of impurities into the substrate to form regions of one or another type of conductivity therein or to make ohmic contact to active semiconductor regions that have been formed on the surface of the substrate. This is accomplished by creating preselected patterns of conductivity zones of different types and terminal regions for those zones by the use of small intericately appertured diffusion and alloying masks for protecting predetermined portions of the surface of the semiconductor wafer during fabrication while exposing other surfaces to the influence of the diffusing and alloying materials. Very small cutaway portions or apertures having diameters as small as .2 to 5 mils and junction spacings of about 0.1 mil at the surface of a diffused transistor may be required for some applications. Such extremely small dimensional requirements, together with precise electrical characteristics, are difficult to realize in semiconductor devices which are fabricated in this multiple fashion.

In addition, it is often necessary to form moats in the substrate in order to isolate regions of semiconductor material useful in the subsequent formation of active semiconductor devices. The moats that are formed in the substrate very often are made after the formation of corresponding moats in an insulating protective layer so as to permit an etchant solution to etch away the moats in the substrate while using the insulating layer as a mask.

In the past it has been known to utilize silicon monoxide as a mask for the purpose of providing a thin, impervious, adherent film on designated surface areas of a semiconductor wafer or substrate. Silicon monoxide is one of several materials which is receiving wide acceptance in a semiconductor art for use as a diffusion and alloying mask. Silicon monoxide may be evaporated to form a thin impervious adherent film on predetermined surface areas of a semiconductor wafer. A geometric pattern of tiny apertures in the film exposes predetermined areas of a surface of the semi-conductor. The exposed areas or regions are thus conditioned to receive evaporated metal contacts which serve as terminals, or those regions may be subjected to the influence of the vapors or other sources of active impurities which modify the conductivity of the exposed regions. PN junctions and terminals for the regions of different conductivities may thus be made in predetermined areas of a semiconductor device by the use of apertured silicon monoxide films.

Heretofore metal masks have been used with some success in making semiconductor devices. When such masks are employed to form tiny apertures or windows through which the diffusion operations may be accomplished, they have proved to be impractical in the simultaneous manufacture of a multiplicity of semiconductor devices to precise dimensions and uniform electrical characteristics. During diffusion operations, doping impurity atoms not only pass through the apertures in the metal masks resting on the semiconductor wafers but also penetrate with ease the regions under the mask and undesirably alter the conductivity of those regions. Mechanical registration and mounting problems have proved to be entirely too severe when apertured metal masks are employed in the fabrication in multiple of various portions of semiconductor devices.

Correspondingly, it has been, heretofore, extremely difficult to form well defined, small diameter holes or narrow moats in a glass film formed over a semiconductor wafer or integrated circuit structure. A glass film formed on the surface of a semiconductor wafer or substrate serves as both an insulating layer and a protective layer for the semiconductor material. One technique previously employed in the past was to evaporate sodium chloride onto designated portions of a glass film by means of the use of an apertured metal mask. Subsequently, a silicon monoxide film was deposited onto the glass film and also onto the sodium chloride evaporated portions. The sodium chloride portions under the SiO film were dissolved away by using water and then the portions of the silicon monoxide film originally formed on the sodium chloride portions were removed by means of ultrasonic agitation in a hydrogen chloride bath. Therefore, the glass region beneath the originally deposited portions of sodium chloride could now be etched away and the silicon monoxide coating remaining on the glass layer served as a mask for the glass etching operation. However, this technique of forming holes in a glass film has the disadvantage that the original sodium chloride deposition was performed by evaporating sodium chloride onto selected portions of the glass film by means of an apertured metal mask which caused a halo or shadow portion of sodium chloride to be formed on the surface of the glass film in the vicinity of each aperture in the metal mask. Some of the evaporated sodium chloride seeped under the mask through the apertures therein and formed a halo around each of the apertures in the metal mask. Consequently, it was desirable to devise a new method or process for producing holes or moats in glass films which would be more precisely formed and would not result in peeling or enlargement of the holes or moats as occurred previously because of the halo area formed by the sodium chloride deposited layer.

Accordingly, it is an object of this invention to provide an improved method for forming holes or moats in an insulating layer.

It is another object of this invention to provide an improved method for precisely forming holes in a thin glass film for use in making electrical connections to active semiconductor regions located beneath the thin glass film.

It is another object of this invention to provide an improved method for forming small diameter holes and thin moats in a glass film.

It is a still further object of this invention to provide an improved masking process which permits accurate formation of very small openings in thin glass films.

It is another object of this invention to provide an improved method for precisely forming moats in an insulating layer thereby permitting the formation of moats in a semiconductor material located below the insulating layer for isolating regions of the semiconductor material.

In accordance with a particular form of the invention, the method of forming an opening in an insulating layer comprises selectively removing a metal layer formed on the insulating layer to leave a metal plug over the area of the surface of the insulating layer through which an opening is to formed. Preferably, the insulating layer is glass and the metal forming the metal layer is selected from the class of metals that adheres to glass, such as chromium. If desired, copper or any other desired metal can be deposited on the chromium layer to give the metal layer added strength. A masking layer is formed over the exposed surface of the insulating layer and on the top surface portion of the metal plug. The masking layer, which is preferably SiO, forms a strong bond with the insulating layer and is more resistant to etching than the insulating layer. The metal plug and the portion of the insulating layer originally beneath the metal plug are etched away to leave an opening in the insulating layer. The SiO layer is transparent and permits visual observation through a microscope to control the amount or depth of etching that is carried out in the process. In this manner, tapered or enlarged openings in the insulating layer can be avoided.

Also in accordance with a particular form of the invention, the method of forming isolated regions in a semiconductor substrate encapsulated by an insulating layer comprises selectively removing a metal layer formed on the insulating layer to leave a metal plug over the area of the surface of the insulating layer that an opening is to be formed. A masking layer is formed on the exposed portion of the insulating layer and on the top surface portion of the metal plug. The metal plug and the portion of the insulating layer originally directly beneath the metal plug are selectively removed to leave an opening in insulating layer. The portion of the semiconductor substrate directly beneath the opening in the insulating layer is removed thereby forming isolated regions in the semiconductor substrate.

The foregoing and other objects, features and advantages of the invention will be apparent from the following more particular description of a preferred embodiment of the invention as illustrated in the accompanying drawings.

Figure 1:
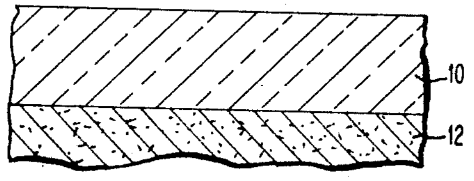
FIG. 1 is a sectional view showing a glass layer located on a semiconductor substrate.

Referring now more particularly to FIG. 1, there is represented, in accordance with one aspect of the present invention, an insulating or glass layer 10 formed on a base or substrate 12. The glass layer 10 is preferably formed on the substrate 12 in accordance with either of the teachings of copending patent applications Ser. No. 141,668 and Ser. No. 181,743, respectively filed Sept. 29, 1961, and Mar. 22, 1962, and respectively entitled "Method of Forming a Glass Film on an Object and the Product Produced Thereby," and "Method of Forming a Glass Film on an Object." The substrate 12 can be any desired material, but preferably of semiconductor material such as silicon that is suitably doped and formed into separate active regions each of which has a conductivity type permitting the formation of a semiconductor device such as a diode or a transistor. Accordingly, the glass layer 10 serves as an encapsulant for semiconductor devices formed in the substrate 12.

Figure 2:
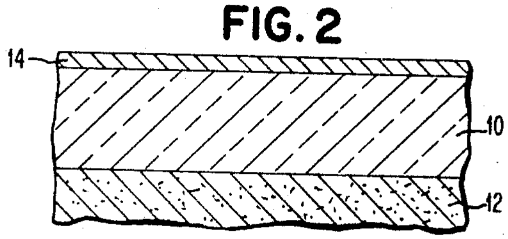
FIG. 2 is a sectional view showing a metal layer formed on the structure of FIG. 1.

With regard to FIG. 2, a metal layer 14 is formed on the glass layer 10 preferably by vaporization. The metal layer 14 can also be sputtered or otherwise deposited or formed on the glass layer 10. The metal layer 14 can be composed of a single layer of chromium or any other suitable metal which will readily bond or adhere to the surface of the glass layer 10. Preferably, copper or any similar metal can be evaporated or formed on the chromium layer to provide a flexible metal layer 14 since the chromium layer by itself is somewhat rigid and susceptible to cracking during thermal cycling. In one example, a layer of chromium having a thickness of 1000 angstroms was evaporated onto the surface of the glass layer. Subsequently, a layer of copper having a thickness of two microns was evaporated onto the chromium layer thereby providing the composite metal layer 14.

Figure 3:
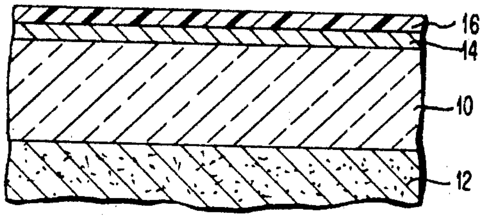
FIG. 3 is a sectional view showing a layer of photoresist material formed on the metal layer of the structure of FIG. 2.

Referring to FIG. 3, a layer of photoresistant material 16 resistant to metal etching solutions is deposited onto the metal layer 14. The photoresist layer 16 can be painted on or deposited in any conventional manner and can be obtained commercially on the market such as from the Kodak Co.

Figure 4:
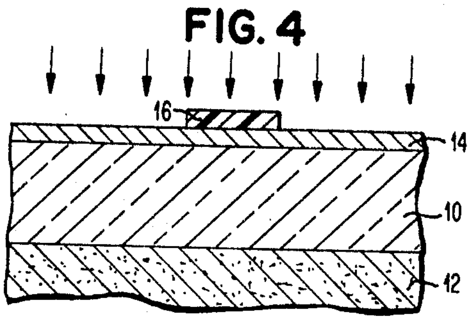
FIG. 4 is a sectional view of the structure of FIG. 3 after a portion of the layer of photoresist material has been removed.

Referring to FIG. 4, a portion of the layer 16 of the photoresist material is etched away in accordance with well known etching techniques. If desired, one technique which can be employed is to form a white pattern with a black background by means of photolithographic techniques, on the surface of the photoresist layer 16. Preferably, the etching technique utilizes the negative process wherein the portion of the layer 16 that is to be etched away is under the black background and the desired portion of the layer 16 that is to remain is under the white pattern. In this manner, exposing the layer of photoresist material to ultraviolet light as shown by the arrows in FIG. 4 serves to activate removal of the undeveloped portion of the photoresist layer 16 (under the black background) while the developed portion of the photoresist layer 16 (under the white pattern) remains on the surface of the metal layer 14. U.S. Patent 3,122,817, to J. Andrus, describes etching techniques and the teachings of the patent are herewith incorporated by reference.

Figure 5:
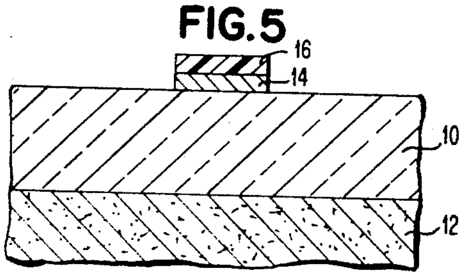
FIG. 5 is a sectional view of the structure of FIG. 4 after a portion of the metal layer has been etched away leaving a metal plug on the glass layer.

Referring to FIG. 5, the portion of the metal layer 14, which is exposed due to the etching away of the portion of photoresist material 16 previously located thereon (FIG. 3) is selectively etched away leaving a portion of the metal layer 14 beneath the remaining portion of the photoresist layer 16. This is done by etching the metal with a metal etching solution which does not affect the photoresist material 16, which is composed of metal etch resistant material. In this manner, the portion of the metal layer 14 that remains on the glass layer 10 is a metal plug that has been carefully formed in accordance with the requirements for an opening that is to be made in the glass layer 10. The exposed copper portion of the metal layer 14 is etched with a 30° C. FeCl solution in a manner known in the art. The chromium portion of the metal layer 14 that is exposed by the above copper etching operation is etched by a solution containing 300 cubic centimeters of water, 60 cubic centimeters of $K_3Fe(CN)_4$, and 18 cubic centimeters of NaOH.

Figure 6:
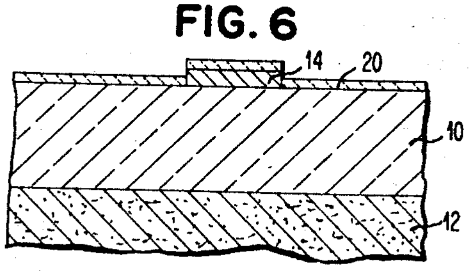
FIG. 6 is a sectional view of the structure of FIG. 5 after the layer of photoresist material has been removed from the top surface of the metal plug and after a layer of silicon monoxide has been deposited onto the structure surface.

Referring to FIG. 6, after the photoresist layer 16 has been removed with a trichloroethylene solution, a thin silicon monoxide layer 20 (about 5,000–10,000 angstroms thick) is deposited by a suitable technique such as by vacuum evaporation onto the exposed glass layer 10 onto the top surface of the metal plug 14. The glass 10 was approximately 2 microns thick in one example. The silicon monoxide layer 20 is transparent permitting visual observation of the subsequent glass etching operation and the SiO layer 20 has a thickness less than the thickness of the metal layer 14 so that deposition of the silicon monoxide material will not cover the sides of the metal plug 14. In addition, SiO is resistant to most glass etching solutions and is not dissolved away unless subjected to boiling in a concentrated HF solution.

Figures 7, 9:
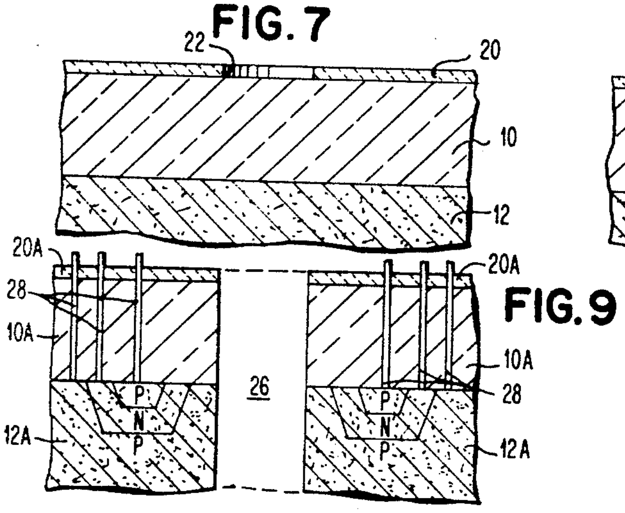
FIG. 7 is a sectional view of the structure of FIG. 6 after the metal plug has been etched away.
FIG. 9 is a sectional view of isolated semiconductor devices wherein the isolation moat is formed by the method of this invention.

Referring to FIG. 7, the metal plug 14 is etched away using the metal etching solutions described above. Consequently, the portion of the silicon monoxide layer 20 formed on the metal plug 14 is also separated away from the remaining portion of the SiO layer 20 thereby forming an opening 22 in the SiO layer 20. Hence, the glass layer 10 has the silicon monoxide coating 20 formed thereon over the entire surface of the glass layer 10 except for the opening 22. The SiO layer 20 now functions to cover any existing pin holes in the glass layer 10 and also serves as a masking layer for a subsequent glass etching operation. Furthermore, the SiO layer is rigid so that patterns formed therein can be very sharp without having tapered edges.

Figure 8:
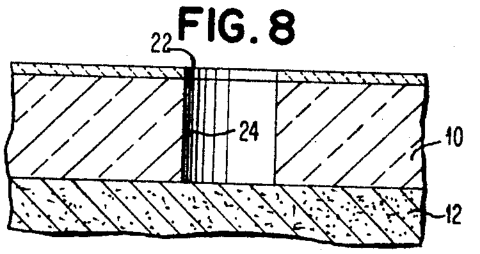
FIG. 8 is a sectional view of the structure of FIG. 7 after an opening has been etched in the glass layer.

Referring to FIG. 8, a suitable glass etchant such as HF is applied to the portion of the glass layer 10 exposed by the opening 22 thereby forming an opening 24 in the glass layer 10. The opening 24 in the glass layer 10 is in alignment with the opening 22 in the SiO layer 20. In this manner, suitable ohmic contact to the substrate 12 can be made by evaporating or otherwise depositing a suitable contact metal into the openings 22 and 24.

Referring to FIG. 9, the above described method for forming an opening in an insulating layer is used to form isolated semiconductor devices. Similar reference numbers are used in the embodiment of FIG. 9 with the addition of the letter A to each number. In the embodiment of FIG. 9, two PNP transistor devices are separated by the technique of etching channels or moats 26 preferably in a grid network pattern. If the substrate 10A is of silicon, a suitable etchant for removing silicon may comprise two cubic centimeters of a silver nitrate solution made up of one gram of silver nitrate in 100 cubic centimeters of distilled water, two cubic centimeters of nitric acid, and one-half cubic centimeter of hydrofluoric acid. The PNP regions in the substrate 10A are preferably formed by known diffusion techniques prior to the glassing operation.

Leads 28 are provided for each of the active semiconductor regions. The leads 28 are electrically conductive metal members that are created by depositing or evaporating the metal into the openings in the glass layer formed by the method of this invention. The glass layer 10A, in one example, had a thickness of between 2 and 3 microns with the diameter of each opening being approximately 0.2 mil. The thickness of the final wafer including the glass layer was approximately 8 mils with the depth of the base region being about 2 microns and the depth of the emitter region being approximately 1.5 microns.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of forming an opening in a glass layer comprising the steps of:

depositing a metal layer onto a surface of said glass layer;

selectively etching away said metal layer to leave a metal plug over the area of the surface of said glass layer in which an opening is to be formed;

forming a film of a rigid, transparent, inorganic dielectric containing a metal or semiconductor compound or mixtures thereof over the exposed portion of said glass layer and the top surface portion of said metal plug, said film forming a strong bond with said glass layer and having a greater resistance to etching than said glass layer; and etching away said metal plug and the portion of said glass layer originally beneath said metal plug to leave an opening in said film and said glass layer while leaving the remaining said film substantially unaffected.

2. The method of claim 1 wherein said glass layer encapsulates a semiconductor substrate and following the formation of said opening in said glass layer further comprising the step of removing the portion of said semiconductor substrate directly beneath the opening in said glass layer thereby forming isolated regions in said semiconductor substrate.

3. A method of forming an opening in a glass layer comprising the steps of:

depositing at least one metal layer onto said glass layer, said metal layer forming a strong bond with said glass layer;

selectively etching away said metal layer to leave a metal plug over the area of said glass layer in which an opening is to be formed;

depositing a layer of silicon monoxide over the exposed portion of said glass layer and the top surface portion of said metal plug, said silicon monoxide layer having a thickness less than the height of said metal plug; and etching away said metal plug and the portion of said glass layer originally beneath said metal plug to leave an opening in said glass layer.

4. A method of forming an opening in a glass layer comprising the steps of:

depositing a layer of chromium having a thickness of about 1000 angstroms onto said glass layer, said layer of chromium forming a strong bond with said glass layer;

depositing a layer of copper having a thickness of about 2 microns on said layer of chromium;

forming a layer of photoresist material on said copper layer;

photolithographically forming a pattern of a desired configuration on the surface of said layer of photoresist material;

bombarding the surface of said layer of photoresist material with ultraviolet light to remove the portions of said layer of photoresist material affected thereby as defined by the pattern formed thereon;

selectively etching away each of said metal layers to leave a metal plug beneath the remaining portion of said layer of photoresist material and over the area of said glass layer in which an opening is to be formed;

removing the remainder of said layer of photoresist material located on the surface portion of said metal plug;

depositing a layer of silicon monoxide over the exposed portion of said glass layer and the top surface portion of said metal plug, said silicon monoxide layer having a thickness less than the height of said metal plug; and etching away said metal plug and the portion of said glass layer originally beneath said metal plug to leave an opening in said glass layer.

5. A method of forming isolated regions in a semiconductor substrate encapsulated by a glass layer comprising the steps of:

depositing at least one metal layer onto said glass layer, said metal layer forming a strong bond with said glass layer;

selectively etching away said metal layer to leave a metal plug over the area of said glass layer in which an opening is to be formed;

depositing a layer of silicon monoxide over the exposed portion of said glass layer and the top surface portion of said metal plug, said silicon monoxide layer having a thickness less than the height of said metal plug;

etching away said metal plug and the portion of said glass layer originally beneath said metal plug to leave an opening in said glass layer; and removing the portion of said semiconductor substrate directly beneath the opening in said glass layer thereby forming isolated regions in said semiconductor substrate.

6. A method of forming isolated regions in a semiconductor substrate encapsulated by a glass layer comprising the steps of:

depositing a layer of chromium having a thickness of about 1000 angstroms onto said glass layer, said layer of chromium forming a strong bond with said glass layer;

depositing a layer of copper having a thickness of about 2 microns on said layer of chromium;

forming a layer of photoresist material on said copper layer;

photolithographically forming a pattern of a desired configuration on the surface of said layer of photoresist material;

bombarding the surface of said layer of photoresist material with ultraviolet light to remove the portions of said layer of photoresist material affected thereby as defined by the pattern formed thereon;

selectively etching away each of said metal layers to leave a metal plug beneath the remaining portion of said layer of photoresist material and over the area of said glass layer in which an opening is to be formed;

removing the remainder of said layer of photoresist material located on the surface portion of said metal plug;

depositing a layer of silicon monoxide over the exposed portion of said glass layer and the top surface portion of said metal plug, said silicon monoxide layer having a thickness less than the height of said metal plug;

etching away said metal plug and the portion of said glass layer originally beneath said metal plug to leave an opening in said glass layer; and removing the portion of said semiconductor substrate directly beneath the opening in said glass layer thereby forming isolated regions in said semiconductor substrate.

References Cited

UNITED STATES PATENTS

| | | | |
|---|---|---|---|
| 3,046,176 | 7/1962 | Bosenberg | 156—11 |
| 3,288,662 | 11/1966 | Weisberg | 156—11 |
| 3,307,239 | 3/1967 | Lepselter et al. | 29—25.3 |

JACOB H. STEINBERG, *Primary Examiner.*

U.S. Cl. X.R.

29—578, 589; 156—16, 17